United States Patent [19]

Ide et al.

[11] 4,404,481
[45] Sep. 13, 1983

[54] CAPACITANCE TO VOLTAGE CONVERSION APPARATUS

[75] Inventors: Toshimine Ide; Takeshi Shimamoto, both of Hirakata; Yoshiaki Igarashi, Ikoma, all of Japan

[73] Assignee: Matsushita Electric Industrial Co., Ltd., Osaka, Japan

[21] Appl. No.: 312,846

[22] Filed: Oct. 19, 1981

[30] Foreign Application Priority Data

Oct. 20, 1980 [JP] Japan .............................. 55-147201
Nov. 21, 1980 [JP] Japan .............................. 55-164980

[51] Int. Cl.³ ..................... G06G 7/10; H03K 3/017
[52] U.S. Cl. .................................. 307/491; 307/228; 307/265; 328/181; 328/185
[58] Field of Search ............... 307/228, 308, 491, 265, 307/494; 328/181, 185; 323/288, 243

[56] References Cited

U.S. PATENT DOCUMENTS 3,559,082  1/1971  Horn ................................. 307/228
3,769,598 10/1973  Schauffele et al. ................. 328/185
4,016,498  4/1977  Hadley ............................. 307/228

Primary Examiner—Stanley D. Miller
Assistant Examiner—B. P. Davis
Attorney, Agent, or Firm—Wenderoth, Lind & Ponack

[57] ABSTRACT

A C-V(capacitance-to-voltage) conversion apparatus usable e.g. for detecting physical parameters such as pressure, distance and angle. The apparatus comprises a capacitive sensor, a C-PW(capacitance-to-pulse width) conversion circuit, and a PW-V(pulse width-to-voltage) conversion circuit. The capacitive sensor converts a physical parameter to a capacitance, but has a non-linear conversion characteristic. The C-PW conversion circuit converts the capacitance to a pulse signal whose mean value is proportional to the capacitance, by controlling a charging-discharging cycle of the capacitive sensor and a reference capacitor. The PW-V conversion circuit converts the pulse signal to a d.c. voltage and at the same time compensates for the non-linearity of the capacitive sensor's conversion characteristic so that the d.c. voltage is proportional to the physical parameter.

3 Claims, 17 Drawing Figures

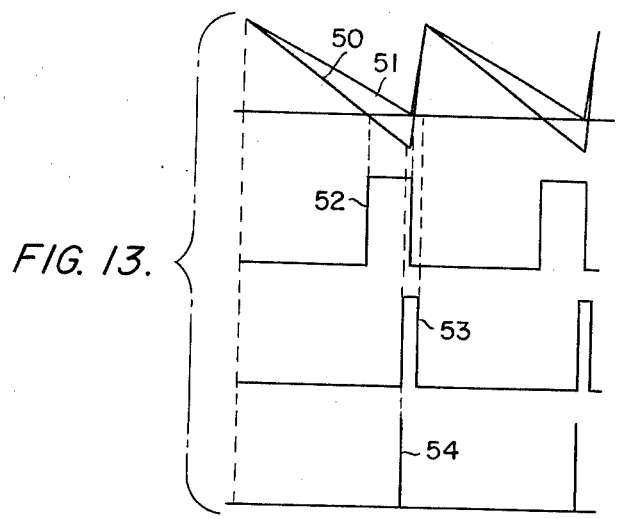
FIG. 13.
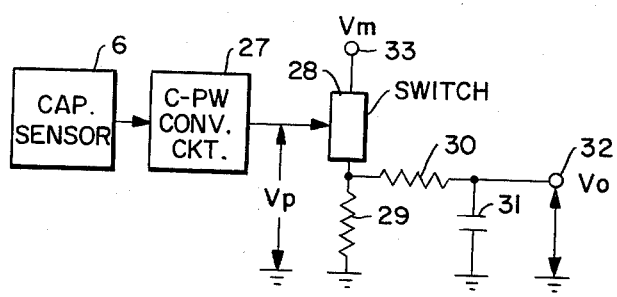
FIG. 14.
FIG. 15.
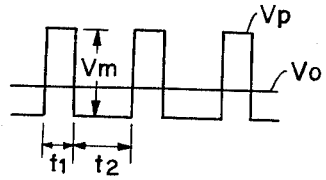
FIG. 16.
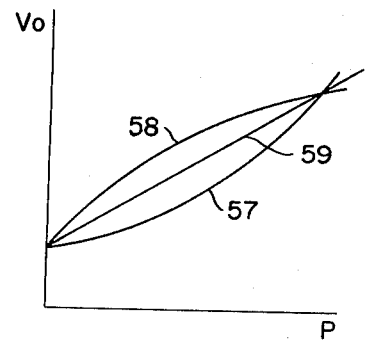
FIG. 17.
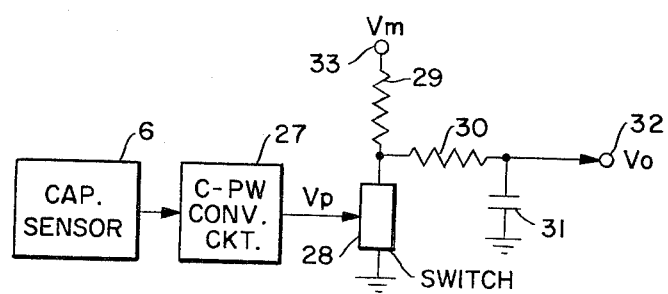

CAPACITANCE TO VOLTAGE CONVERSION APPARATUS

BACKGROUND OF THE INVENTION

This invention relates to a C-V(capacitance-to-voltage) conversion apparatus which converts a capacitance change of a capacitive sensor into a d.c. voltage signal, and more particularly to a C-V conversion apparatus for a sensor which is of great use in detecting changes of physical parameters such as pressure, distance and angle.

Capacitive sensors mainly composed of parallel plate electrodes printed on parallel diaphragms (made of crystal or alumina) are well-known. For example, a pressure-sensing capacitor has been introduced in U.S. Pat. No. 3,858,097 as a typical capacitive sensor. This type of capacitive sensor is mainly composed of two parallel plate electrodes facing each other and two parallel diaphragms spanning a gap therebetween. The peripheries of the two parallel diaphragms are fixed to each other. The two parallel plate electrodes are printed one each on the two diaphragms, respectively. Usually, one of the diaphragms is used as a fixed diaphragm so that the plate electrode printed on it is used as a fixed electrode, and the other diaphragm is used as a movable diaphragm so that the plate electrode printed on it is used as a movable diaphragm. In other words, a capacitor is formed by the fixed plate electrode and the movable plate electrode. The movable diaphragm is supposed to move according to changes of the physical parameter so that the gap between the two plate electrodes changes. Accordingly, the capacitance between the two electrodes changes corresponding to changes of the physical parameter.

For obtaining a d.c. voltage signal corresponding to this capacitance change, some types of C-V conversion apparatus have already been introduced. The above said U.S. Pat. No. 3,858,097 exhibits a C-V conversion apparatus composed of an operational amplifier and a transformer. C-V conversion apparatuses using diode-quad bridges are exhibited in U.S. Pat. No. 3,869,676 and Japanese published unexamined patent (Kokai) No. 54-115175.

However, these conventional C-V conversion apparatuses have the following problems:

(i) They have complex circuit configurations for compensating for the non-linearity of the C-V conversion characteristics.

(ii) It is necessary for them to be provided with elements having the completely same electrical and physical characteristics, such as completely the same four diodes.

(iii) Circuit adjustments for the initial balanced states of the apparatuses are difficult.

(iv) The capacitive sensor is treated as an ideal parallel plate capacitor. In other words, such effects are not practically considered such as non-uniform deviation of the movable diaphragm between the neighborhood of the center and the neighborhood of the periphery. Because of this non-uniformity of deviation, the capacitive sensor actually is not an ideal parallel plate capacitance. This must be considered when highly accurate detection of the physical parameter is required.

BRIEF SUMMARY OF THE INVENTION

An object of this invention is to provide a C-V conversion apparatus which converts the capacitance change of a capacitive sensor into a d.c. voltage signal proportional to the capacitance change.

Another object of this invention is to provide a C-V conversion apparatus which converts the capacitance change of a capacitive sensor (capacitance of which is changed corresponding to changes of a physical parameter) into a d.c. voltage signal proportional to the physical parameter change.

A further object of this invention is to provide a C-V conversion apparatus which has a simple circuit configuration.

A still further object of this invention is to provide a C-V conversion apparatus which does not require any additional linearity compensation circuits.

A C-V (capacitance-to-voltage) conversion apparatus of this invention is usable e.g. for detecting physical parameters such as pressure, distance and angle. The apparatus comprises a capacitive sensor, a C-PW(capacitance-to-pulse width) conversion circuit, and a PW-V(pulse width-to-voltage) conversion circuit. The capacitive sensor converts a physical parameter to a capacitance, but has a non-linear conversion characteristic. The C-PW conversion circuit converts the capacitance to a pulse signal whose mean value is proportional to the capacitance, by controlling a charging-discharging cycle of the capacitive sensor and a reference capacitor. The PW-V conversion circuit converts the pulse signal to a d.c. voltage and at the same time compensates for the non-linearity of the capacitive sensor's conversion characteristic so that the d.c. voltage is proportional to the physical parameter.

BRIEF DESCRIPTION OF THE DRAWING

These and other objects and features of this invention will become apparent from the following description and the accompanying drawings in which:

FIG. 13 is a wave form diagram of signals appearing at various points in the circuit shown in FIG. 12;

FIG. 14 is a schematic block diagram of an example of a PW-V conversion circuit used for this invention;

FIG. 15 is a wave form diagram of the output signal of a C-PW conversion circuit shown in FIG. 14;

FIG. 16 is a graph illustrating a correction effect obtained by this invention; and FIG. 17 is a schematic block diagram of another example of the PW-V conversion circuit used for this invention.

DETAILED DESCRIPTION OF THE INVENTION

First, the principle of this invention will be described by using a capacitive pressure sensor as an example, which sensor detects pressure in terms of capacitance change.

Figure 1:
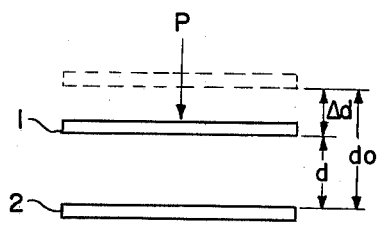
FIG. 1 is a schematic illustration of an ideal capacitive sensor.

FIG. 1 shows an ideal capacitive sensor (i.e. an ideal parallel plate capacitor). Referring to FIG. 1, 1 is a movable electrode, 2 is a fixed electrode, p is a pressure, $d_0$ is a gap distance between the electrodes 1 and 2 when no pressure is applied, $\Delta d$ is the amount of deviation of the gap when the pressure p is applied, and d is the gap distance when the pressure p is applied. Assume that $C_0$ is an initial capacitance (i.e. a capacitance when no pressure is applied) of the capacitive sensor, C is a capacitance when the pressure p is given, and S is an area of one surface of each of the electrodes. The amount of deviation $\Delta d$ is proportional to the applied pressure p so that:

$$d = d_0 - \Delta d = d_0 - k_1 p \text{ (where } k_1 \text{ is a constant)} \quad (1)$$

$$\therefore p = (d_0 - d)/k_1 \quad (2)$$

$$= (1 - d/d_0)/k_2 \text{ (where } k_2 = d_0/k_1 \text{: constant)}.$$

On the other hand, the capacitance $C_0$ and C are expressed as:

$$C_0 = \epsilon S/d_0, C = \epsilon S/d \text{ (where } \epsilon \text{ is a specific inductive capacity)} \quad (3)$$

$$d/d_0 = C_0/C \quad (4)$$

Thus, the pressure p is expressed from the equations (2) and (4) as follows:

$$p = k_2(1 - C_0/C) \quad (5)$$

Accordingly, $(1 - C_0/C)$ is proportional to the pressure p.

Next, assume that there are two capacitors $C_0$ and C both of which are charged to have a reference voltage $V_{ref2}$. Further assume such an operation cycle that (i) the capacitors $C_0$ and C are charged at the same time by charging circuits having the same characteristic, respectively, (ii) the capacitors $C_0$ and C will stop being charged and begin discharging when the voltage of the capacitor C reaches a reference voltage $V_{ref1}$, and (iii) the capacitors $C_0$ and C will stop discharging and again begin being charged when the voltage of the capacitor C returns to the reference voltage $V_{ref2}$. In this operation cycle, a period Ta exists during which the voltage of the capacitor $C_0$ is higher than the reference voltage $V_{ref1}$.

Here, let us introduce a rectangular pulse signal $v_p$ which has a constant amplitude $v_{pm}$ during the period Ta.

Figure 2:
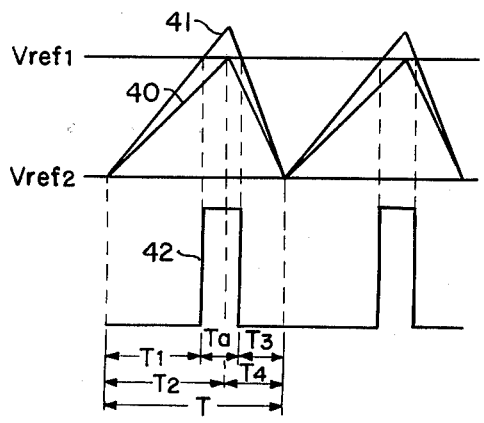
FIG. 2 and FIG. 3 are schematic wave form diagrams for illustrating a principle of this invention.

FIG. 2 shows a wave form diagram of the above said operation cycle. Referring to FIG. 2, 40 is a charging-discharging wave form of the capacitor C, 41 is a charging-discharging wave form diagram of the capacitor $C_0$, and 42 is the above said pulse signal $v_p$. From FIG. 2, $$T_1/T_2 = C_0/C, T_3/T_4 = C_0/C \quad (6)$$

$$\therefore (T_1 + T_3)/T = C_0/C \text{ (where T is a period of the operation cycle)} \quad (7)$$

thus, $$Ta/T = 1 - (T_1 + T_3)/T = 1 - C_0/C \quad (8)$$

The mean value $V_p$ of the pulse signal 5 is expressed as follows:

$$V_p = v_{pm} \cdot Ta/T = v_{pm} \cdot (1 - C_0/C) \quad (9)$$

From the above equation (5) and (9), the mean value $V_p$ of the pulse signal $v_p$ is proportional to the pressure p.

Figure 3:
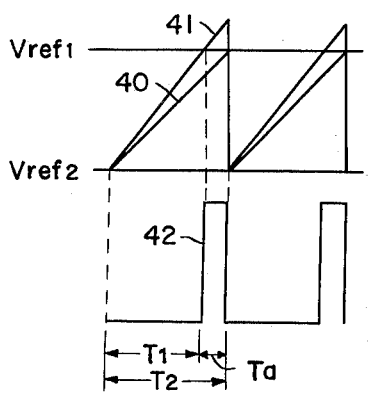

FIG. 3 shows another wave form diagram of the above said operation cycle when the capacitor $C_0$ and C discharge in one and the same moment. The principle operation in this case shown in FIG. 3 is basically the same as that shown in FIG. 2, so that the description of FIG. 3 is omitted here.

Figure 4:
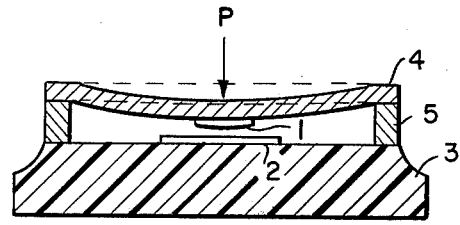
FIG. 4 is schematic sectional view of a capacitive sensor.

In the foregoing descriptions, the ideal capacitive sensor has been considered. However, an actual capacitive sensor is not the ideal parallel plate capacitor. FIG. 4 shows a schematic section view of an actual capacitive sensor. Referring to FIG. 4, 3 is a substrate, 4 is a diaphragm, 5 is a hermetically sealing ring, 1 is a movable electrode printed on the diaphragm 4, and 2 is a fixed electrode printed on the substrate 3. When a force (a physical parameter) P is applied to the diaphragm 2, the diaphragm will deviate. The amount of this deviation is maximum at the center of the diaphragm 4 and becomes smaller at the parts nearer the periphery of the diaphragm 4, because the diaphragm 4 is fixed to the substrate 3 at the periphery through the hermetically sealing ring 5. In other words, the gap distance of the electrodes 1 and 2 is not uniformly changed. For making the capacitive sensor an ideal parallel plate capacitor, the area of the movable electrode 1 is made considerably smaller than that of the diaphragm 4 so that the movable electrode 1 remains flat shaped even if the diaphragm 4 is deviated non-uniformly. However, this non-uniform deviation will appear as a detection error (of the physical parameter) when highly accurate detection is required. The non-uniform deviation influence is that $(1 - C_0/C)$ is not proportional to the physical parameter P in the case of the actual capacitive sensor.

Figure 5:
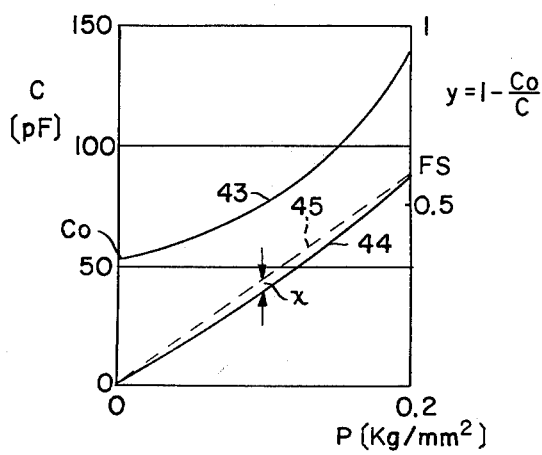
FIG. 5 is a graph showing a characteristic curve of the capacitive sensor shown in FIG. 4.

FIG. 5 shows a typical characteristic curve of the actual capacitive sensor. Referring to FIG. 5, P is the physical parameter, 43 is a capacitance changing curve of the capacitive sensor, 44 is the $(1 - C_0/C)$ (y, hereafter) curve of the same sensor, FS is a full scale value which is the value of y with respect to the maximum value of the physical parameter P, 45 is an imaginary straight line when y is assumed to be linearly changed from 0 to FS, and x is a maximum difference between y curve 44 and the imaginary straight line 45.

A linearity L is defined by the following equation:

$$L = (x/FS) \cdot 100 \ (\%) \quad (10)$$

The actual value of L is about 2%. This error of linearity must be corrected for using the capacitive sensor when highly accurate linearity in detection is required.

This invention is to effectively achieve this correction of the non-linearity without using any additional correction circuits.

Figure 6:
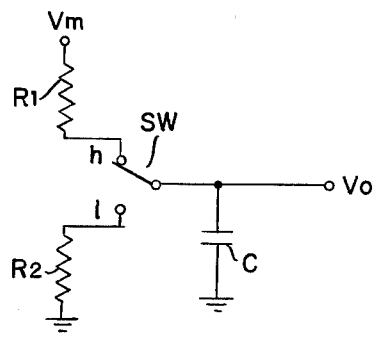
FIG. 6 is a principle circuit configuration of a pulse width-d.c. voltage (PW-V) conversion circuit used for this invention.

FIG. 6 shows a pulse width-d.c. voltage (PW-V, hereafter) conversion circuit composed of two resistors and a capacitor. Referring to FIG. 6, $R_1$ is a charging resistor and $R_2$ is a discharging resistor, C is a capacitor, $V_m$ is a power source voltage, $V_0$ is a d.c. output voltage, and SW is a change-over switch. The switch SW connects a connecting point h during a period $t_1$ and connects a connecting point l during a period $t_2$. The periods $t_1$ and $t_2$ are alternately repeated. Accordingly, the capacitor C is charged by the voltage $V_m$ through the resistor $R_1$ during the period $t_1$, and discharges through the resistor $R_2$ during the period $t_2$, alternately. In this case, the output voltage $V_0$ is expressed as:

$$V_0 = \frac{V_m t_1}{t_1 + t_2} + \frac{V_m}{t_1 + t_2} \cdot \frac{(1 - \epsilon^{-t_1/\tau_1})(1 - \epsilon^{-t_2/\tau_2})}{1 - \epsilon^{-(t_1/\tau_1 + t_2/\tau_2)}} (\tau_2 - \tau_1) \quad (11)$$

where, $\tau_1 = CR_1$ (a charging time constant), $\tau_2 = CR_2$ (a discharging time constant). In the equation (11), the first term gives the mean value, and the second term gives the error from the mean value. Supposing that the mean value is $V_{av}$, it is expressed as:

$$V_{av} = V_m t_1/(t_1+t_2) \quad (12)$$

From the equation (11), the output voltage $V_0$ has the following three different characteristics according to the values of the charging resistor $R_1$ and the discharging resistor $R_2$:

(α) $V_0 = V_{av}$ if $R_1 = R_2$;
(β) $V_0 < V_{av}$ if $R_1 > R_2$;
(γ) $V_0 > V_{av}$ if $R_1 < R_2$.

Figure 7:
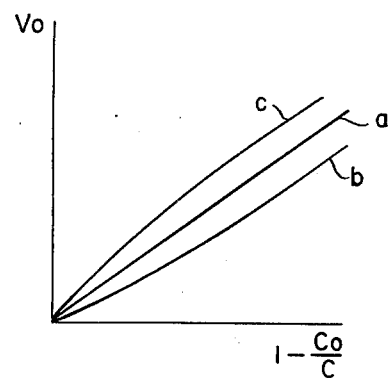
FIG. 7 is a graph showing a characteristic curve of the PW-V conversion circuit shown in FIG. 6.

These characteristics (α), (β) and (γ) are shown in FIG. 7.

The non-linearity (shown in FIG. 5) of the capacitive sensor can be corrected by using the characteristic (γ) of the PW-V conversion circuit according to this invention.

Hereinafter, this invention will be described with reference to some effective embodiments.

Figure 8:
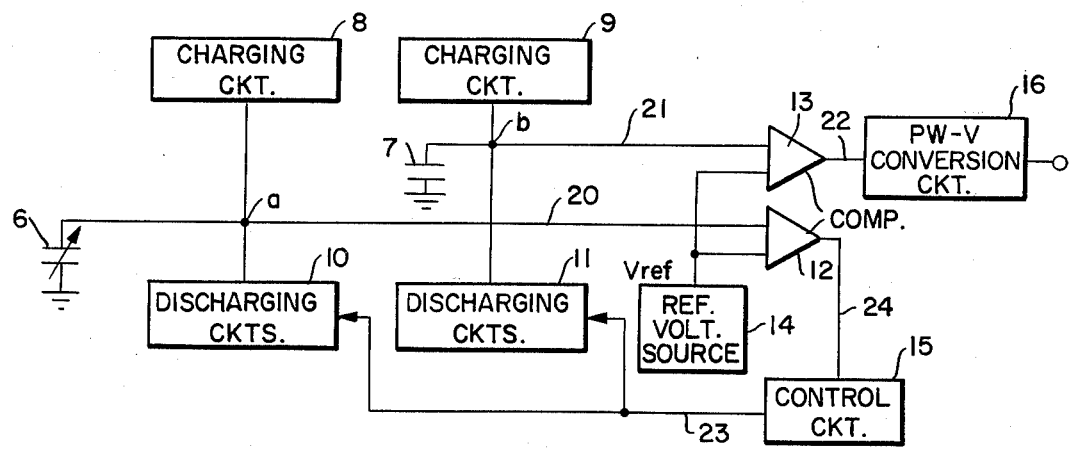
FIG. 8 is a schematic circuit diagram in block form of an example of a C-V conversion apparatus according to this invention.
Figure 9:
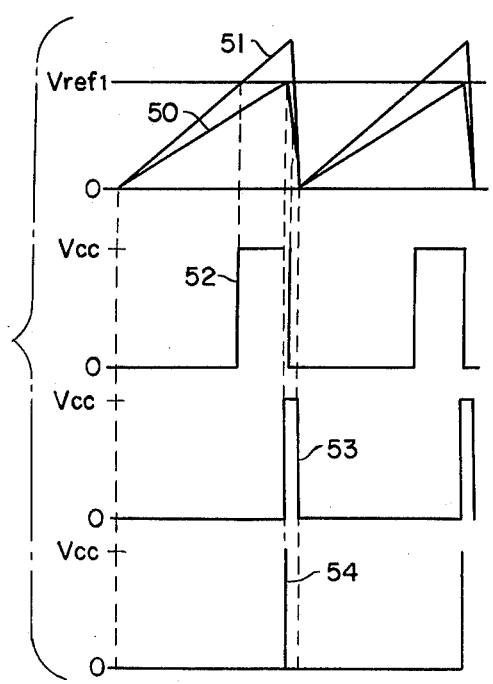
FIG. 9 is a wave form diagram of signals appearing at various points in the circuit shown in FIG. 8.

FIG. 8 shows a block diagram of an embodiment according to this invention. Referring to FIG. 8, 6 is a capacitive sensor, 7 is a reference capacitor, 8 and 9 are charging circuits, 10 and 11 are discharging circuits, 12 and 13 are comparators, 14 is a reference voltage source for generating a reference voltage $V_{ref1}$, 15 is a charging/discharging control circuit (a monostable multivibrator in this embodiment), and 16 is a PW-V conversion circuit. FIG. 9 shows a wave form diagram of the circuit shown in FIG. 8. Referring to FIG. 9, 50 is a charging-discharging wave form of the capacitive sensor 6 (at a point a), 51 is a charging-discharging wave form of the reference capacitor 7 (at a point b), 52 is an output signal of the comparator 13, 53 is an output signal of the charging/discharging control circuit 15, and 54 is an output signal of the comparator 12.

Initially, the capacitive sensor 6 and the reference capacitor 7 have no charges so that the voltages at the points a and b are 0 V. From this state, the capacitive sensor 6 and the reference capacitor 7 are charged by the charging circuits 8 and 9, respectively, so that the voltages at the points a and b rise gradually. When the voltage 51 at the point b becomes higher than the reference voltage $V_{ref1}$, the output signal 52 of the comparator 13 rises to a high level ($V_{cc}$, a power source voltage) from an initial low level (0 V). When further time passes and the voltage 50 at the point a becomes higher than the reference voltage $V_{ref1}$, the output signal 54 of the comparator 12 rises to high level from low level so as to trigger the charging/discharging control circuit 15. The charging/discharging control circuit 15 then generates a pulse signal 53 having a specified pulse width so as to operate the discharging circuits 10 and 11. Accordingly, the charges of the capacitive sensor 6 and the reference capacitor 7 are discharged. The charges of the capacitive sensor 6 and the reference capacitor 7 are completely discharged during the period corresponding to the pulse width of the output pulse signal 53 of the comparator 15, and accordingly, the voltages at the points a and b return to 0 V. On the way that the voltage 50 at the point a returns to 0 V, when the voltage 50 becomes lower than the reference voltage $V_{ref1}$, the output signal 54 of the comparator 12 returns to low level. On the way that the voltage 51 at the point b returns to 0 V, when the voltage 51 becomes lower than the reference voltage $V_{ref1}$, the output signal 52 returns to low level. When the output pulse signal 53 of the charging/discharging control circuit is terminated, the discharging circuits 10 and 11 stop their discharging operations so that the capacitive sensor 6 and the reference capacitor 7 again begin being charged, i.e. the next operation cycle starts.

By repeating the above said operation cycle, the pulse signal 52 at the output of the comparator 13 is obtained as the signal whose mean value is changed proportional to the change of the physical parameter applied to the capacitive sensor 6. The pulse signal 52 is converted to the d.c. voltage proportional to the physical parameter by means of the PW-V conversion circuit 16.

Figure 10:
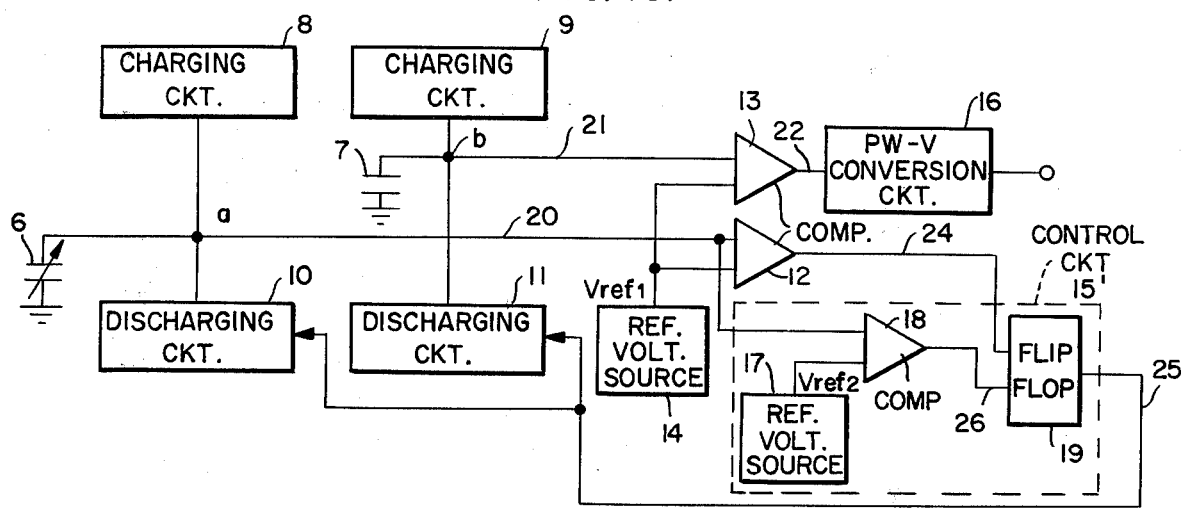
FIG. 10 is a schematic block diagram of another example of a C-V conversion apparatus according to this invention.
Figure 11:
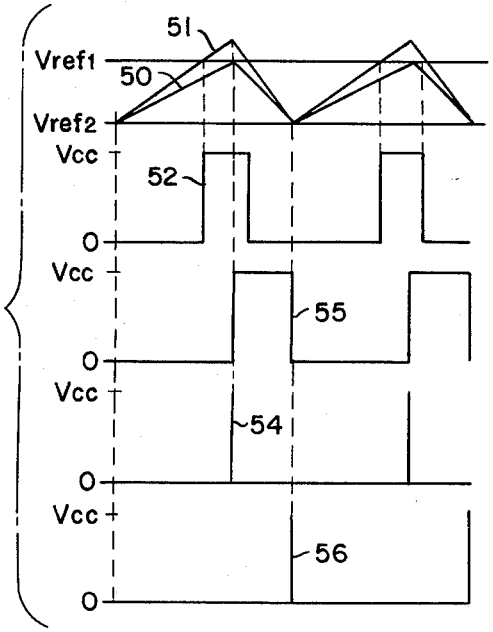
FIG. 11 is a wave form diagram of signals appearing at various points in the circuit shown in FIG. 10.

FIG. 10 shows a block diagram of another embodiment according to this invention. Referring to FIG. 10, 15' is the charging/discharging control circuit, 17 is a reference voltage source for generating a reference voltage $V_{ref2}$ 18 is a comparator, 19 is a flip-flop circuit, and the other circuit components are the same as those in FIG. 8. FIG. 11 shows a wave form diagram of the circuit shown in FIG. 10.

Initially, the capacitive sensor 6 and the reference capacitor 7 have no charges so that the voltages at the points a and b are 0 V. From this state, the capacitive sensor 6 and the reference capacitor 7 are charged by the charging circuits 8 and 9, respectively, so that the voltages at the points a and b rise gradually. When the voltage 51 at the point b becomes higher than the reference voltage $V_{ref1}$, the output signal 52 of the comparator 13 rises to high level from low level. When further time passes and the voltage 50 at the point a becomes higher than the reference voltage $V_{ref1}$, the output signal 54 of the comparator 12 rises to high level from low level so as to set the flip-flop circuit 19. An output signal 55 of the flip-flop circuit 19 becomes high level so as to operate the discharging circuits 10 and 11, so that the charges of the capacitive sensor 6 and the reference capacitor 7 are discharged through the discharging circuits 10 and 11, respectively. Accordingly, the voltages at the points a and b drop gradually. When the voltage 51 at the point b becomes lower than the reference voltage $V_{ref1}$, the output signal 52 of the comparator 13 returns to low level from high level. When further time passes and the voltage 50 at the point a becomes lower than the reference voltage $V_{ref2}$, an output signal 56 of the comparator 18 is inverted so as to reset the flip-flop circuit 19. The output signal 55 of the flip-flop circuit 19 drops to low level so as to stop the operation of the discharging circuits 10 and 11, so that the capacitive sensor 6 and the reference capacitor 7 begin being charged again, i.e. the next operation cycle starts.

By repeating this operation cycle, the output signal 52 of the comparator 13 can be obtained as the pulse signal 52 whose mean value is changed proportional to the change of the physical parameter. The pulse signal 52 is converted by the PW-V conversion circuit 16 to a d.c. voltage signal whose voltage is changed proportional to the change of the physical parameter.

Figure 12:
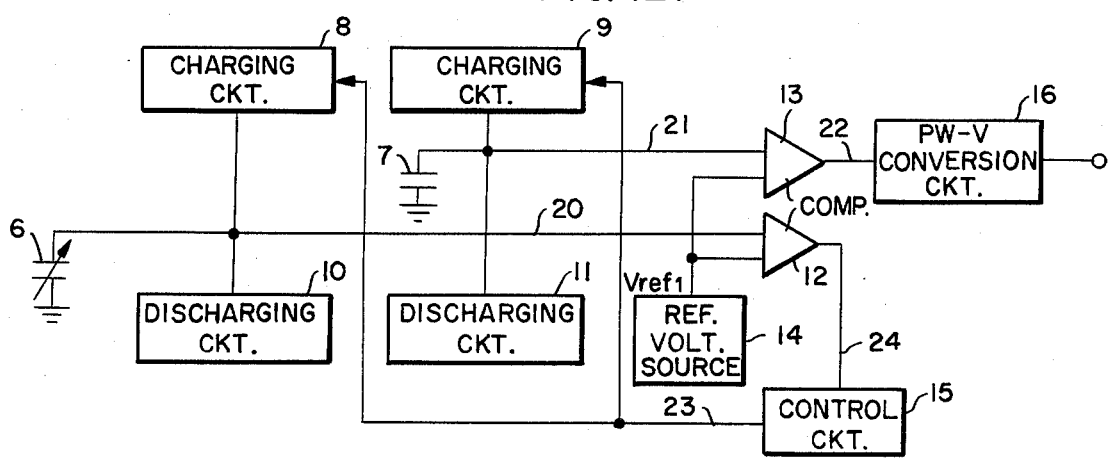
FIG. 12 is a schematic block diagram of a further example of a C-V conversion apparatus according to this invention.

FIG. 12 shows a block diagram of a further embodiment according to this invention. FIG. 13 shows a wave form diagram of the circuit shown in FIG. 12. In this embodiment, the charging circuits 8 and 9 are controlled by the output signal of the monostable multivibrator (charging/discharging control circuit) 15. The operation cycle of this circuit can be easily understood by the above said descriptions about the circuits in FIG. 8 and in FIG. 10, so that detail descriptions of the circuit in FIG. 12 are omitted here.

Next, the role of the PW-V conversion circuit 16 for correcting the non-linearity of the capacitive sensor 6 will be described in detail.

FIG. 14 shows a circuit diagram of an embodiment of the PW-V conversion circuit 16 used for this invention. Referring to FIG. 14, 6 is the capacitive sensor, 27 is a capacitance-pulse width conversion circuit as described in the foregoing composed of the reference capacitor, the charging circuits, the discharging circuits, the reference voltage source, the comparators, and the charging-/discharging control circuit, 28 is a switch (e.g. a transistor switch) which is controlled to be 'on' or 'off' by the above said pulse signal $v_p$ (the output signal 52 of the comparator 13), 29 and 30 are resistors, and 31 is a capacitor for charging and discharging. The resistors 29, 30 and the capacitor 31 form a low-pass filter. The switch 28 is connected to a power source terminal 33 at one end, the resistor 29 is connected to ground at one end, and the switch 28 and the resistor 29 are connected in series. FIG. 15 shows a wave form diagram of the pulse signal $v_p$. Referring to FIG. 15, Vm is the amplitude (equal to the power source voltage) of the pulse signal $v_p$, $t_1$ is the pulse width, $t_2$ is the pulse interval, and $V_0$ is a d.c. output voltage that appears at an output terminal 32 shown in FIG. 14.

The switch 28 is 'on' during the period $t_1$ so that the capacitor 31 is charged through the resistor 30, and is 'off' during the period $t_2$ so that the capacitor 31 discharges through the resistors 30 and 29. This charging-discharging cycle will be continuously repeated. After enough time has passed, the d.c. output voltage $V_0$ can be obtained at the output terminal 32. In the charging-discharging cycle, the charging time constant is the product of the resistance of the resistor 30 and the capacitance of the capacitor 31, and the discharging time constant is the product of the sum of the resistors 29 and 30 and the capacitor 31. Accordingly, the discharging time constant is larger than the charging time constant. That is, the PW-V conversion circuit in FIG. 14 has the above said characteristic ($\gamma$), so that it can correct the non-linearity of the capacitive sensor 6. The curvature of the characteristic curve ($\gamma$) can be determined by the resistance values of the resistors 29 and 30.

FIG. 16 shows a graphical representation for illustrating the non-linearity correction effect by the PW-V conversion circuit shown in FIG. 14. Referring to FIG. 16, 57 is the capacitance changing curve of the capacitive sensor 6, 58 is the transfer characteristic curve($\gamma$) of the PW-V conversion circuit 16, and 59 is a linear changing characteristic obtained by combining the curves 57 and 58.

In the foregoing descriptions, the case has been described in which the capacitive sensor has the structure as shown in FIG. 4 and has the characteristic as shown in FIG. 5. However, if a different capacitive sensor is used which has the characteristic of deviating oppositely to that in FIG. 5, the non-linearity of the capacitive sensor can also be corrected by using the PW-V conversion circuit having a configuration as shown in FIG. 17. As can easily be understood, the PW-V conversion circuit shown in FIG. 17 has the above said characteristic ($\alpha$).

In view of the foregoing, this invention can provide: (1) a C-V conversion apparatus which converts the capacitance change of a capacitive sensor into a d.c. voltage signal proportional to the capacitance change; (2) a C-V conversion apparatus which converts the capacitance change of a capacitive sensor (capacitance of which is changed corresponding to the change of a physical parameter) into a d.c. voltage signal proportional to the physical parameter change; (3) a C-V conversion apparatus which has a simple configuration; and (4) a C-V conversion apparatus which does not require any additional non-linearity compensation circuits.

What is claimed is:

1. A C-V conversion apparatus comprising:
   a capacitive sensor whose capacitance is changed corresponding to a change of a physical parameter;
   a reference capacitor;
   a first charging circuit for charging said capacitive sensor;
   a second charging circuit for charging said reference capacitor;
   a first discharging circuit for discharging said capacitive sensor;
   a second discharging circuit for discharging said reference capacitor;
   a charging/discharging control means for controlling a charging and discharging cycle of said capacitive sensor and said reference capacitor;
   a reference voltage source for generating a reference voltage;
   a first comparator for comparing a voltage of said capacitive sensor with said reference voltage and for generating a control signal to control said charging/discharging control means;
   a second comparator for comparing a voltage of said reference capacitor with said reference voltage and for generating a pulse signal whose mean value is proportional to a capacitance of said capacitive sensor; and
   a pulse width-voltage conversion circuit for convertng said pulse signal to a d.c. voltage signal, said pulse width-voltage conversion circuit having a characteristic for compensating for a non-linear conversion characteristic of said capacitive sensor by selecting a charging time constant and a discharging time constant of said pulse width-voltage conversion circuit so that said d.c. voltage signal is proportional to said physical parameter.

2. A C-V conversion apparatus according to claim 1, wherein said charging/discharging control means comprises a monostable multivibrator.

3. A C-V conversion apparatus according to claim 1, wherein said charging/discharging control means comprises: a second reference voltage source for generating a second reference voltage; a third comparator for comparing the voltage of said capacitive sensor with said second reference voltage and for generating a second control signal; and a flip-flop circuit for controlling said charging and discharging cycle, said flip-flop circuit being set by said control signal and reset by said second control signal.

* * * * *